US010194563B2

(12) United States Patent
Tsuyuno et al.

(10) Patent No.: US 10,194,563 B2
(45) Date of Patent: Jan. 29, 2019

(54) POWER CONVERSION DEVICE

(71) Applicant: HITACHI AUTOMOTIVE SYSTEMS, LTD., Hitachinaka-shi, Ibaraki (JP)

(72) Inventors: Nobutake Tsuyuno, Tokyo (JP); Eiichi Ide, Tokyo (JP); Takeshi Tokuyama, Tokyo (JP)

(73) Assignee: HITACHI AUTOMOTIVE SYSTEMS, LTD, Hitachinaka-shi (JP)

( * ) Notice: Subject to any disclaimer, the term of this patent is extended or adjusted under 35 U.S.C. 154(b) by 0 days.

(21) Appl. No.: 15/500,391

(22) PCT Filed: Jun. 8, 2015

(86) PCT No.: PCT/JP2015/066428
§ 371 (c)(1),
(2) Date: Jan. 30, 2017

(87) PCT Pub. No.: WO2016/038956
PCT Pub. Date: Mar. 17, 2016

(65) Prior Publication Data
US 2017/0223875 A1    Aug. 3, 2017

(30) Foreign Application Priority Data
Sep. 9, 2014    (JP) .................... 2014-182844

(51) Int. Cl.
*H05K 7/20* (2006.01)
*H01L 23/473* (2006.01)
(Continued)

(52) U.S. Cl.
CPC ..... *H05K 7/20927* (2013.01); *H01L 21/4878* (2013.01); *H01L 21/56* (2013.01);
(Continued)

(58) Field of Classification Search
CPC ....... H01L 23/34; H01L 21/00; H01L 25/112; H01L 25/115; H02M 7/003;
(Continued)

(56) References Cited

U.S. PATENT DOCUMENTS 5,940,272 A    8/1999  Emori et al.
2009/0116197 A1*    5/2009  Funakoshi .......... H01L 21/4882
                                                                361/719
(Continued)

FOREIGN PATENT DOCUMENTS

JP    6-244326 A    9/1994
JP    10-51912 A    2/1998
(Continued)

OTHER PUBLICATIONS

English translation, Inverter device, JP2008306793, pp. 1-16.*

*Primary Examiner* — Nguyen Tran
(74) *Attorney, Agent, or Firm* — Foley & Lardner LLP

(57) ABSTRACT

An object of the present invention is to provide a power conversion device that suppresses a bypass flow and has superior heat dissipation performance. The power conversion device according to the present invention includes a power semiconductor module 300 and a flow channel formation body 1000 on which the power semiconductor module 300 is disposed. The power semiconductor module 300 has a high thermal conductor 920 which is disposed at a position between a semiconductor chip and the flow channel formation body 1000 and a sealing material that seals a power semiconductor element and the high thermal conductor 920. The high thermal conductor 920 has a fin protruding to the flow channel formation body 1000 at the side of the flow channel formation body 1000 and a part of the sealing material surrounding the fin and a leading edge of the fin are on almost the same plane.

11 Claims, 20 Drawing Sheets

(51) Int. Cl.
　　*H01L 25/07*　　　(2006.01)
　　*H01L 25/18*　　　(2006.01)
　　*H01L 21/56*　　　(2006.01)
　　*H01L 23/31*　　　(2006.01)
　　*H01L 25/00*　　　(2006.01)
　　*H02M 1/084*　　　(2006.01)
　　*H02M 7/00*　　　(2006.01)
　　*H02M 7/5387*　　(2007.01)
　　*H01L 21/48*　　　(2006.01)
　　*H01L 23/495*　　(2006.01)

(52) U.S. Cl.
　　CPC ........ *H01L 23/3142* (2013.01); *H01L 23/473* (2013.01); *H01L 23/4735* (2013.01); *H01L 23/49541* (2013.01); *H01L 23/49562* (2013.01); *H01L 23/49568* (2013.01); *H01L 25/07* (2013.01); *H01L 25/072* (2013.01); *H01L 25/18* (2013.01); *H01L 25/50* (2013.01); *H02M 1/084* (2013.01); *H02M 7/003* (2013.01); *H02M 7/5387* (2013.01); *H01L 23/49537* (2013.01); *H01L 23/49575* (2013.01); *H01L 2224/0603* (2013.01); *H01L 2224/40137* (2013.01); *H01L 2224/48091* (2013.01); *H01L 2224/48247* (2013.01); *H01L 2924/181* (2013.01)

(58) Field of Classification Search
　　CPC .......... H05K 7/20927; H05K 7/20154; H05K 7/20409; H05K 7/20436; H05K 7/20445; H05K 7/20472; H05K 7/20463; H01R 13/6675; G06F 1/20; G06F 2200/201
　　See application file for complete search history.

(56) References Cited

U.S. PATENT DOCUMENTS

| | | | |
|---|---|---|---|
| 2011/0299265 | A1 | 12/2011 | Nakatsu et al. |
| 2012/0300522 | A1* | 11/2012 | Tokuyama ............ H01L 25/072 363/131 |
| 2013/0264702 | A1 | 10/2013 | Nishi et al. |
| 2015/0043164 | A1* | 2/2015 | Joshi ..................... G06F 1/20 361/699 |

FOREIGN PATENT DOCUMENTS

| | | |
|---|---|---|
| JP | 2001-217363 A | 8/2001 |
| JP | 2008-306793 A | 12/2008 |
| JP | 2009-303341 A | 12/2009 |
| JP | 2010-110143 A | 5/2010 |
| JP | 2011-166973 A | 8/2011 |
| JP | 2012-161242 A | 8/2012 |
| JP | 2013-232614 A | 11/2013 |

* cited by examiner

POWER CONVERSION DEVICE

TECHNICAL FIELD

The present invention relates to a power semiconductor module and a power conversion device using the same.

BACKGROUND ART

Because a power conversion device using switching of a power semiconductor element has high conversion efficiency, the power conversion device is used widely for consumer use, a vehicle, a railroad, and a transformation facility. Because the power semiconductor element generates heat by energization, high heat dissipation is required. In addition, the power semiconductor element is sealed with resin or gel for insulation.

A structure for mounting the power semiconductor element on a metal body provided with a flow channel and sealing the power semiconductor element with the resin is disclosed in PTL 1.

CITATION LIST

Patent Literature

PTL 1: Japanese Unexamined Patent Publication No. 2013-232614

SUMMARY OF INVENTION

Technical Problem

In a semiconductor device described in PTL 1, the power semiconductor element is solder-connected to a water channel in which watertight performance is previously secured and is sealed with the resin. For this reason, a temperature or a pressure may be added in the manufacturing course and the watertight performance may be deteriorated.

An object of the present invention is to facilitate formation of a power semiconductor module in which a bypass flow is suppressed and heat dissipation efficiency is high and improve reliability of a power conversion device.

Solution to Problem

A power conversion device according to the present invention includes: a power semiconductor module which has a power semiconductor element to convert a direct current into an alternating current; and a flow channel formation body on which the power semiconductor module is disposed, wherein the power semiconductor module has a high thermal conductor which is disposed at a position between the semiconductor chip and the flow channel formation body and a sealing material that seals the power semiconductor element and the high thermal conductor, the high thermal conductor has a fin protruding to the flow channel formation body at a side of the flow channel formation body, and a part of the sealing material surrounding the fin and a leading edge of the fin are on almost the same plane.

Advantageous Effects of Invention

According to the present invention, a power semiconductor module and a flow channel can be easily formed, a bypass flow can be suppressed, a water flow can be efficiently guided to a fin, and high heat dissipation can be realized.

DESCRIPTION OF EMBODIMENTS

Figure 1:
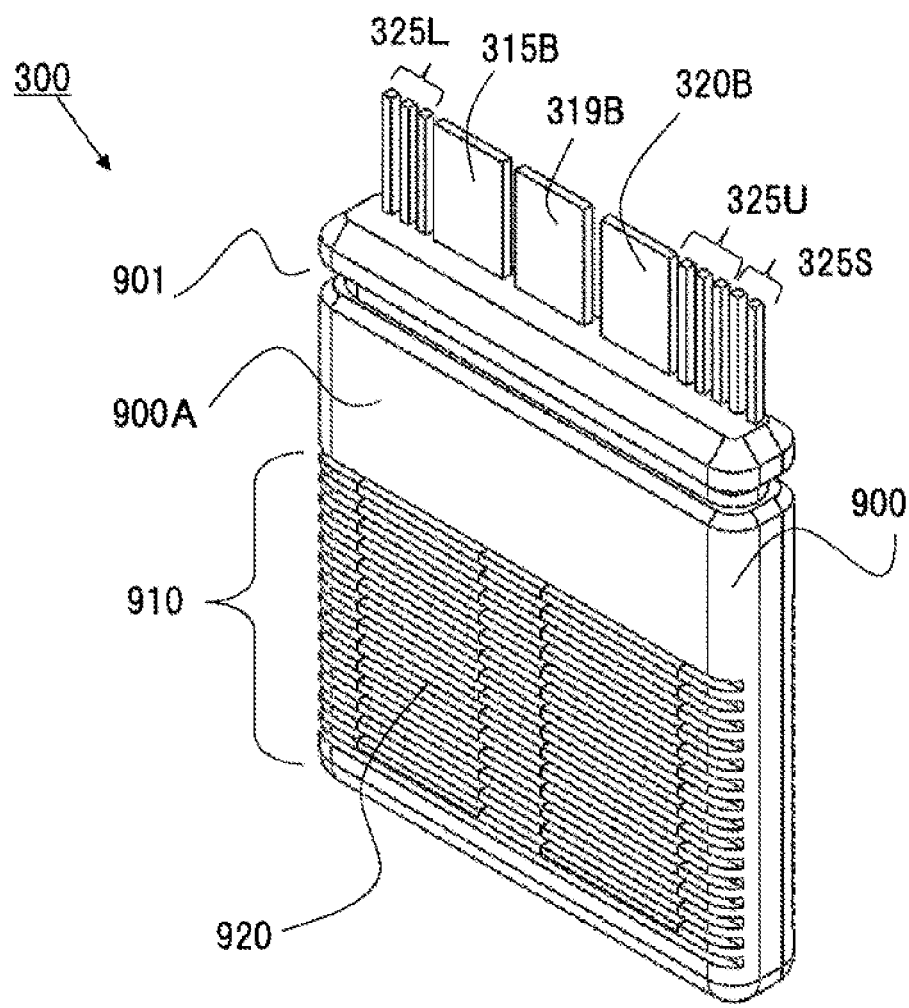
FIG. 1 is a perspective view of a power semiconductor module according to a first embodiment.

Embodiments of a power semiconductor module and a power conversion device according to the present invention are hereinafter described with reference to the drawings. Note that the same elements in the drawings will be denoted by the same reference numerals, and redundant descriptions will be omitted.

First Embodiment

FIG. 1 is a perspective view of a power semiconductor module 300 according to this embodiment. The power semiconductor module 300 has a sealing resin 900, direct current-side terminals 315B and 319B, an alternating current-side terminal 320B, and terminals 325U, 325L, and 325S for signals. The sealing resin 900 seals a power semiconductor element that is mounted on a metal conductor such as a lead frame and a ceramic substrate wiring line. The terminals 315B, 319B, and 320B protrude from one surface of the sealing resin 900 of the power semiconductor module 300 in a line. A sealing portion 901 is formed in the sealing resin 900 of a side where these terminals protrude. As described below, when the power semiconductor module 300 is fixed on a flow channel formation body 1000, airtightness of a cooling medium is secured by a member such as an O ring disposed in the sealing portion 901. In addition, the sealing resin 900 has a sealing resin surface 900A. A sequence for manufacturing the power semiconductor module 300 according to this embodiment will be described using FIGS. 2 to 7.

Figure 2:
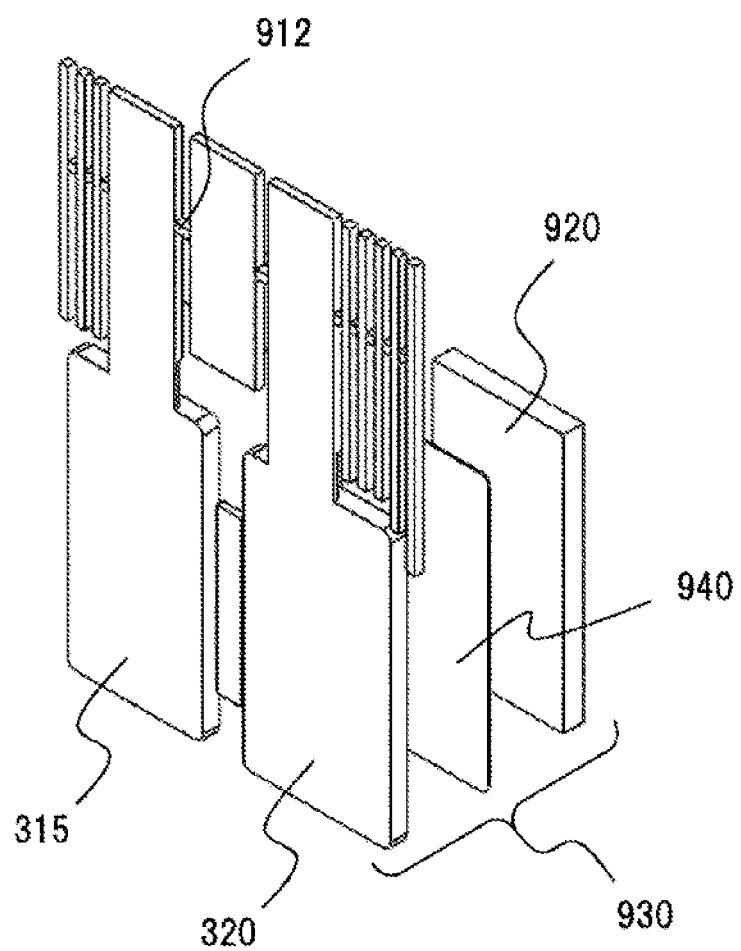
FIG. 2 is a development diagram of a connector-side lead set according to the present invention.

FIG. 2 is a development diagram illustrating an arrangement relation of a lead frame 315 and a lead frame 320 and a high thermal conductor 920. An upper arm-side IGBT 155 to be a power semiconductor element to be described below is connected to the lead frame 315. A lower arm-side IGBT 157 to be a power semiconductor element to be described below is connected to the lead frame 320. The lead frame 315 and the lead frame 320 are configured using a conductive metal member, for example, copper. Here, the IGBT is an abbreviation for an insulated gate bipolar transistor.

The high thermal conductor 920 is disposed at a side opposite to a side to which the power semiconductor element is connected, with the lead frame 315 or the lead frame 320 between the high thermal conductor 920 and the power semiconductor element. The high thermal conductor 920 is provided to correspond to each lead frame. Although not illustrated in FIG. 2, the high thermal conductor 920 is also disposed in a region facing the lead frame 315.

An insulating layer 940 is disposed between the high thermal conductor 920 and the lead frame 315 and between the high thermal conductor 920 and the lead frame 320. The insulating layer 940 is a member that is disposed for the purpose of electrically insulating the lead frame and the high thermal conductor from each other. As an example of the insulating layer 940, an epoxy resin-based resin sheet filled with alumina particles and boron nitride particles is used. The high thermal conductor 920 adheres to the lead frame via the insulating layer 940. The insulating layer is heated and compressed using a vacuum press machine and is cured. As conditions used for heating and compression, a compression atmosphere in which a vacuum degree is 1000 Pa or less, a pressure of 10 MPa, 200° C., and two hours are used.

The lead frame 315 and the lead frame 320 are formed in a state in which the lead frame 315 and the lead frame 320 are connected by a tie bar 912. For this reason, the high thermal conductor 920 and the lead frame are assembled as an integrated collector-side lead set 930 with the insulating layer 940 between the high thermal conductor 920 and the lead frame.

Figure 3:
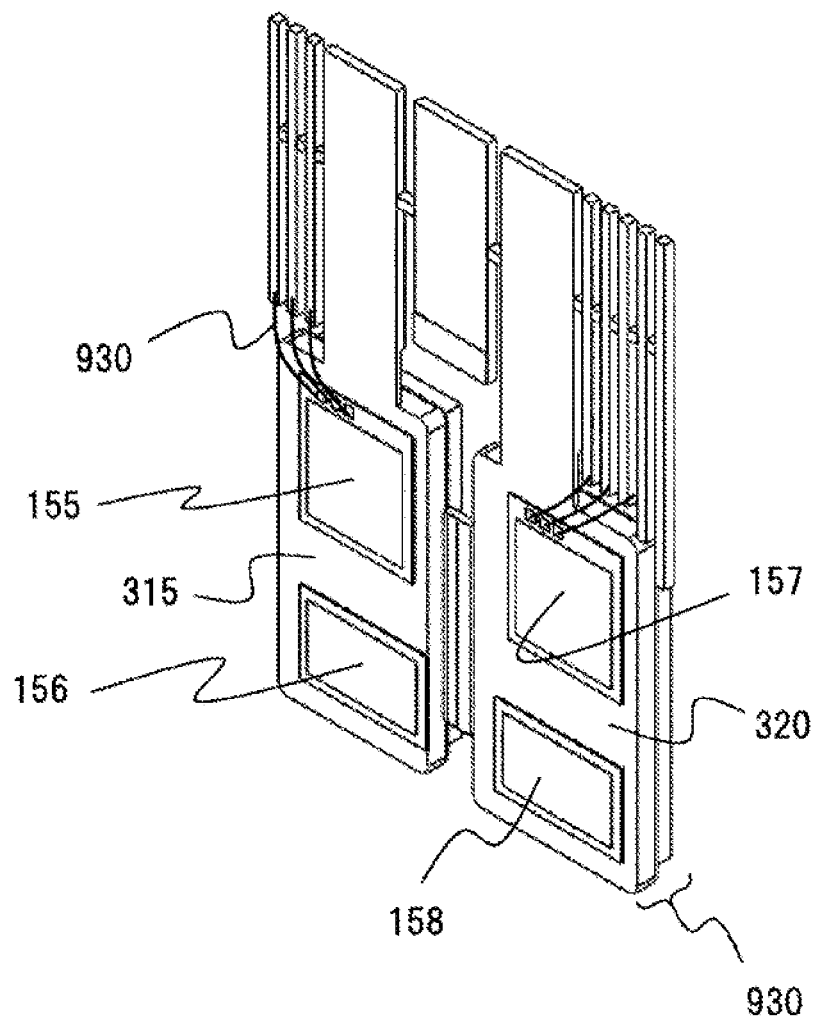
FIG. 3 is a perspective view of a process for manufacturing a power semiconductor module according to the present invention.

FIG. 3 is a diagram illustrating a state in which the power semiconductor element is connected to the lead frame, from a state of FIG. 2. The IGBT 155 configuring an upper arm circuit of an inverter circuit is solder-connected to the lead frame 315. A diode 156 configuring the upper arm circuit of the inverter circuit is solder-connected to the lead frame 315. The IGBT 157 configuring a lower arm circuit of the inverter circuit is solder-connected to the lead frame 320. A diode 158 configuring the lower arm of the inverter circuit is solder-connected to the lead frame 320. In the IGBTs 155 and 157, electrodes for signals are formed on surfaces on which emitter electrodes are formed. The signal electrodes are electrically connected to the signal terminals 325L and 325L of the power semiconductor module 300 by an aluminum wire. For this reason, the IGBTs 155 and 157 are disposed at positions closer to the signal terminals than the diodes 156 and 158.

Figure 4:
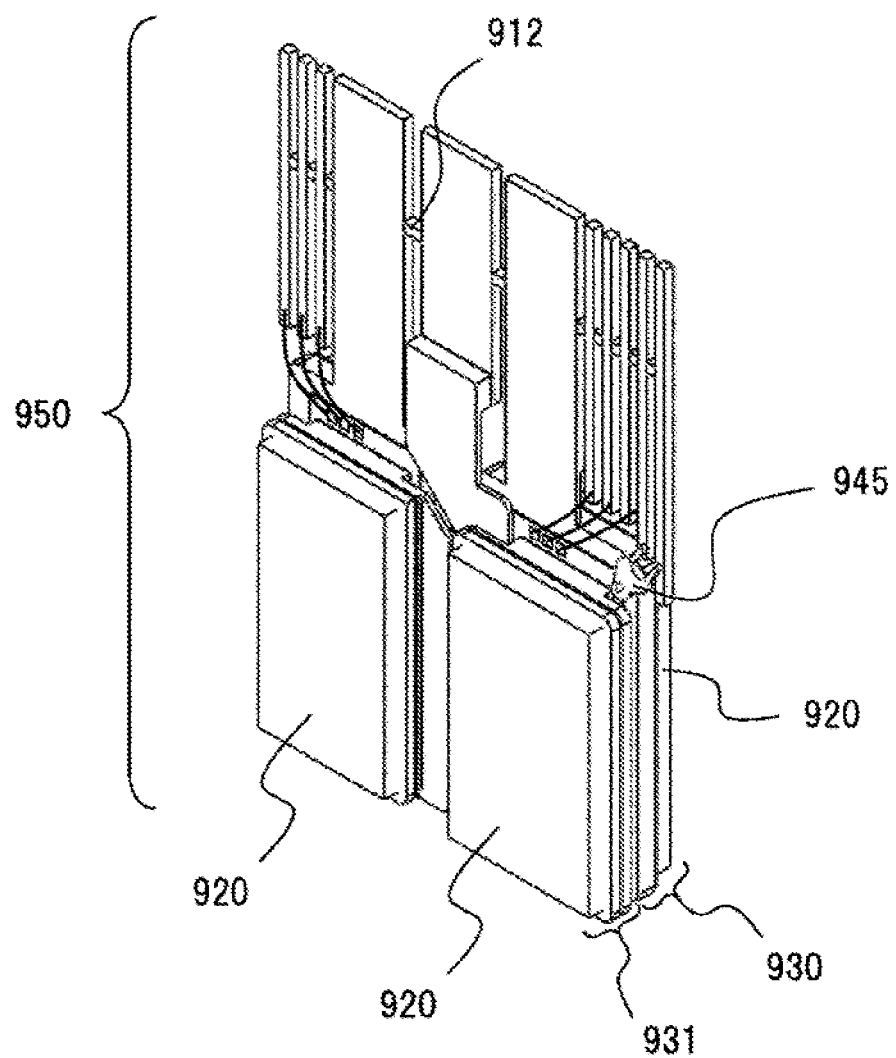
FIG. 4 is a perspective view of a process for manufacturing a power semiconductor module according to the present invention.

FIG. 4 is a diagram illustrating a state in which the lead frame and the high thermal conductor 920 are disposed at an emitter side of the power semiconductor element, from the state of FIG. 3. In the same sequence as when the collector-side lead set 930 is formed in FIG. 2, an emitter-side lead set 931 is formed. The emitter-side lead set 931 includes a lead frame 318 that is connected to the emitter side of the IGBT 155, a lead frame 319 that is connected to the emitter side of the IGBT 157, the high thermal conductor 920, and the insulating layer 940 that is disposed between the high thermal conductor and the lead frame.

In addition, a temperature sensor 945 adheres to the lead frame. A terminal of the temperature sensor 945 is welded to a signal terminal of the collector-side lead set 930. The temperature sensor 945 is provided, so that generation of heat when a fin is formed by mechanical processing is monitored, and management can be performed such that a temperature does not become a temperature more than a specified value.

In this way, the collector-side lead set 930 and the emitter-side lead set 931 are disposed with the power semiconductor element between the collector-side lead set 930 and the emitter-side lead set 931. An assembly of the collector-side lead set 930 and the emitter-side lead set is called a lead assembly 950.

Figure 5:
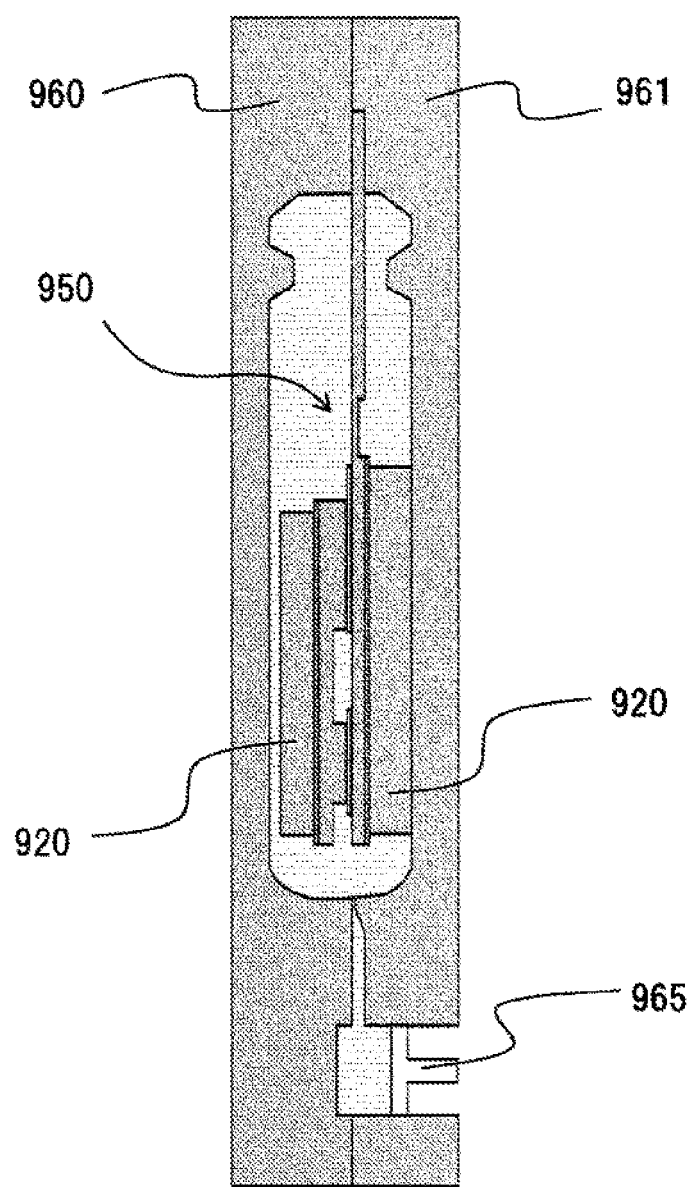
FIG. 5 is a perspective view of a process for manufacturing a power semiconductor module according to the present invention.

FIG. 5 is a diagram illustrating a process for performing transfer molding on the lead assembly 950. The lead assembly 950 is set to transfer molding molds 960 and 961 and the sealing resin 900 is injected. A mold temperature is set to 175° C., a molding pressure is set to 10 MPa, and the sealing resin 900 is cured in the mold for three minutes.

Figure 6:
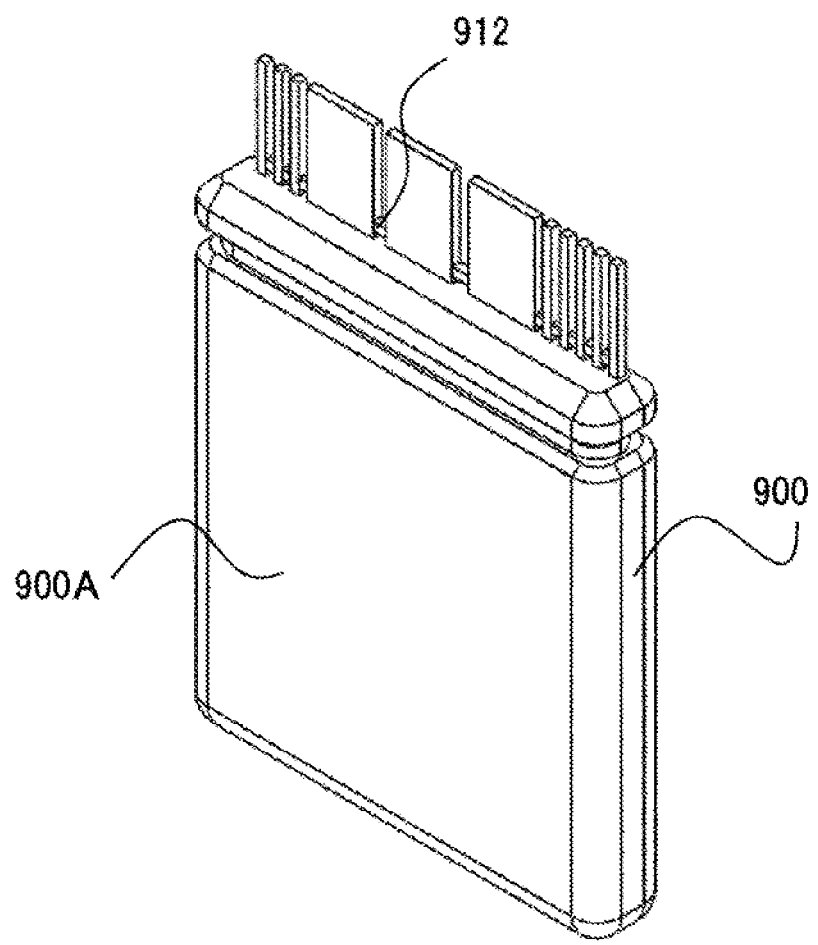
FIG. 6 is a perspective view of a process for manufacturing a power semiconductor module according to the present invention.

FIG. 6 illustrates the case in which transfer molding is performed on the lead assembly 950 using the sealing resin 900. The high thermal conductor 920 is covered with the sealing resin 900. The sealing resin 900 has a sealing resin surface 900A composed of almost the same surface, including a region to cover the high thermal conductor 920. Here, almost the same surface shows a surface manufactured to become the same surface. Specifically, the sealing resin surface 900A has a step of 100 μm or less by cure shrinkage of the sealing resin 900, a thermal expansion difference of the sealing resin 900 and an internal structure such as the high thermal conductor 920, or a satin finish surface formed in the mold. However, the sealing resin surface 900A is defined as almost the same surface.

The tie bar 912 to connect the terminals is cut after transfer molding. As a result, the terminals are electrically isolated from each other.

Figure 7:
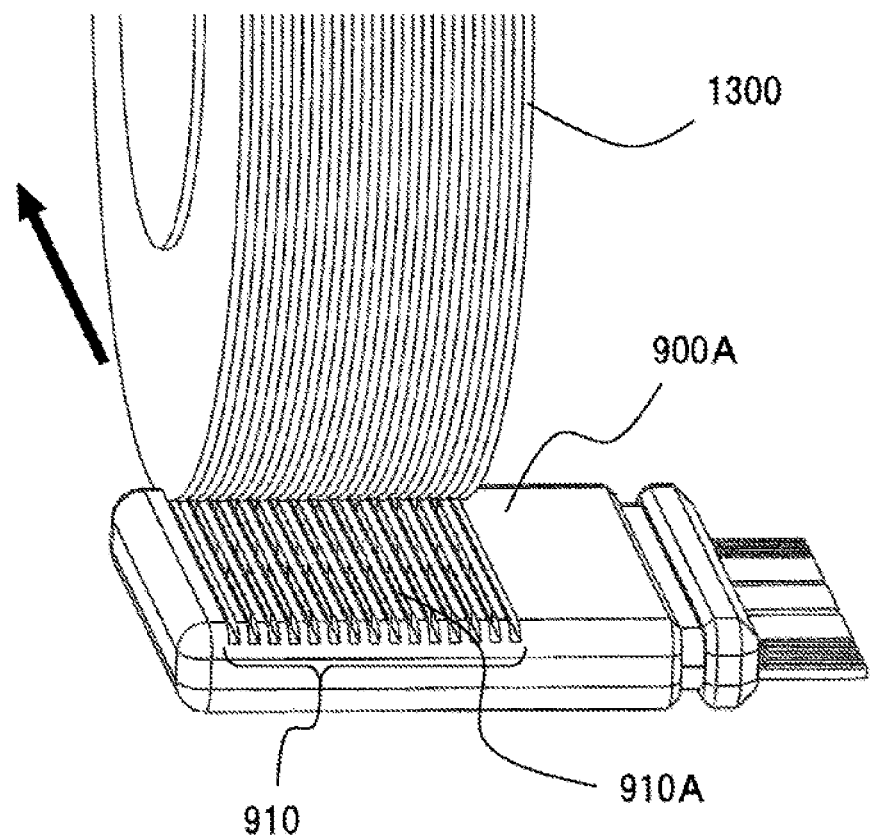
FIG. 7 is a perspective view of a process for manufacturing a power semiconductor module according to the present invention.

FIG. 7 is a diagram illustrating a process for grinding the sealing resin surface 900A and forming fins 910A. The sealing resin surface 900A is ground by rotating a multi blade 1300 at a high speed. The multi blade 1300 has a structure in which a plurality of blades having leading edges attached with abrasive grains are bundled. The multi blade 1300 grinds the sealing resin 900 and the high thermal conductor 920. The ground high thermal conductor 920 forms the fins 910A. A groove depth between the fins is about 1.5 mm.

Because a ground portion generates heat by frictional heat at the time of grinding, the ground portion is cooled by jetting cooling water. In addition, an internal temperature is monitored using the temperature sensor 945 provided in the power semiconductor module and a grinding speed is adjusted such that the internal temperature is not more than 150° C. As a result, solder can be prevented from being remelted by the frictional heat. In addition, the fins 910A can be manufactured easily by grinding by the multi blade.

Figure 8:
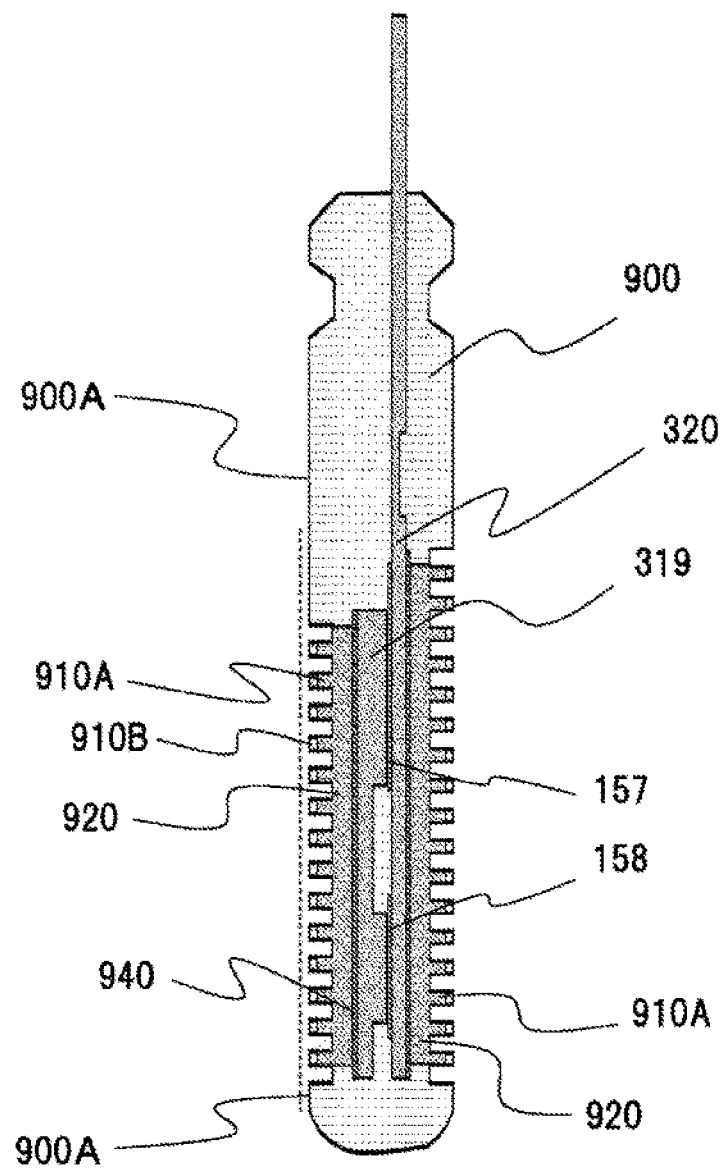
FIG. 8 is a cross-sectional view of a power semiconductor module according to a first embodiment.

FIG. 8 is a cross-sectional view of the power semiconductor module 300. As illustrated in FIG. 8, the portion ground by the multi blade 1300 according to the sequence of FIG. 7 corresponds to a portion in which the high thermal conductor 920 is disposed. In the power semiconductor module according to this embodiment, the fins 910A are formed on both surfaces of the power semiconductor element.

In FIG. 8, the lead frames 319 and 320 are disposed with the IGBT 157 and the diode 158 of the lower arm side of the inverter circuit between the lead frames 319 and 320. The high thermal conductor 920 is disposed at the side opposite to the side where the power semiconductor element is disposed, with the lead frame 319 between the high thermal conductor 920 and the power semiconductor element. Likewise, the high thermal conductor 920 is disposed at the side opposite to the side where the power semiconductor element is disposed, with the lead frame 320 between the high thermal conductor 920 and the power semiconductor element. The insulating layer 940 is disposed between the high thermal conductor 920 and the lead frame.

The high thermal conductor 920 is ground together with the sealing resin 900 and as a result, the fins 910A are formed. As shown by a dotted line of FIG. 8, the fin 910A is formed such that a leading edge of the fin is on almost the same surface as the sealing resin surface 910A. In other words, the fin 910A is formed toward the side opposite to the side where the power semiconductor element is disposed, from a heat dissipation surface formed to be recessed with respect to the sealing resin surface 900A.

In addition, because the fin 910A is formed as illustrated in FIG. 7, as shown by a reference numeral 910B, the sealing resin 900 is disposed on the leading edge of the fin 910A. As such, the leading edge of the fin is originally the sealing resin 900 and is formed to be on almost the same surface as the sealing resin surface 910A, as illustrated in FIG. 6.

In the power semiconductor module 300 according to this embodiment described above, a resin sealing portion sealing the high thermal conductor 920 is ground and the resin sealing portion is processed in a fin shape. In this embodiment, a heat dissipation portion 910 is formed by a method using grinding illustrated in FIG. 7, but this may be realized by other mechanical processing. Because a surrounding portion of the high thermal conductor 920 is sealed with the sealing resin 900, the high thermal conductor 920 is hard to be peeled even when a temperature change is applied. In addition, because the fin 910A is formed and processed after the resin is sealed, the sealing resin 900 does not leak in a fin portion in the manufacturing course and a yield is improved.

As a material of the high thermal conductor 920, a metal material having high thermal conductivity or a material containing carbon can be used. For example, copper, aluminum, copper carbon, aluminum carbon, and graphene can be used. When an aluminum-based material or a material containing carbon is used, cutting processing is easy and productivity is improved.

The material of the sealing resin 900 is not particularly limited. However, transfer mold resin, potting resin, and silicon resin can be used. When the transfer mold resin is used, productivity is high and outer shape precision is high.

Figure 9:
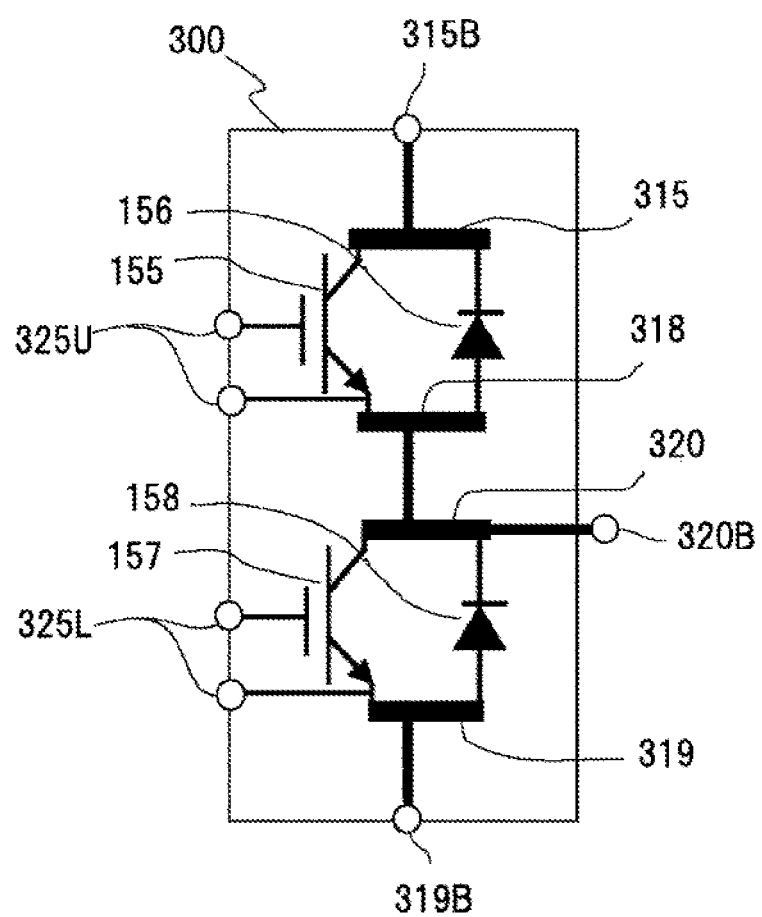
FIG. 9 is a circuit diagram of a power semiconductor module according to the present invention.

FIG. 9 is a circuit diagram of the power semiconductor module according to this embodiment. The terminal 315B is output from a collector side of the upper arm circuit and is connected to a positive electrode side of a battery or a capacitor. The terminal 325U is output from a gate and a sense emitter of the IGBT 155 of the upper arm circuit. The terminal 319B is output from an emitter side of the lower arm circuit and is connected to a negative electrode side of the battery or the capacitor or GND. The terminal 325L is output from a gate and a sense emitter of the IGBT 157 of the lower arm circuit. The terminal 320B is output from a collector side of the lower arm circuit and is connected to a motor. When neutral point grounding is performed, the lower arm circuit is connected to the negative electrode side of the capacitor, not GND.

The power semiconductor module according to this embodiment has a 2in1 structure to be a structure in which the two arm circuits of the upper arm circuit and the lower arm circuit are integrated in one module. When a 3in1 structure, a 4in1 structure, and 6in1 structure other than the 2in1 structure are used, the number of output terminals from the power semiconductor module can be reduced and miniaturization can be realized.

Figure 10:
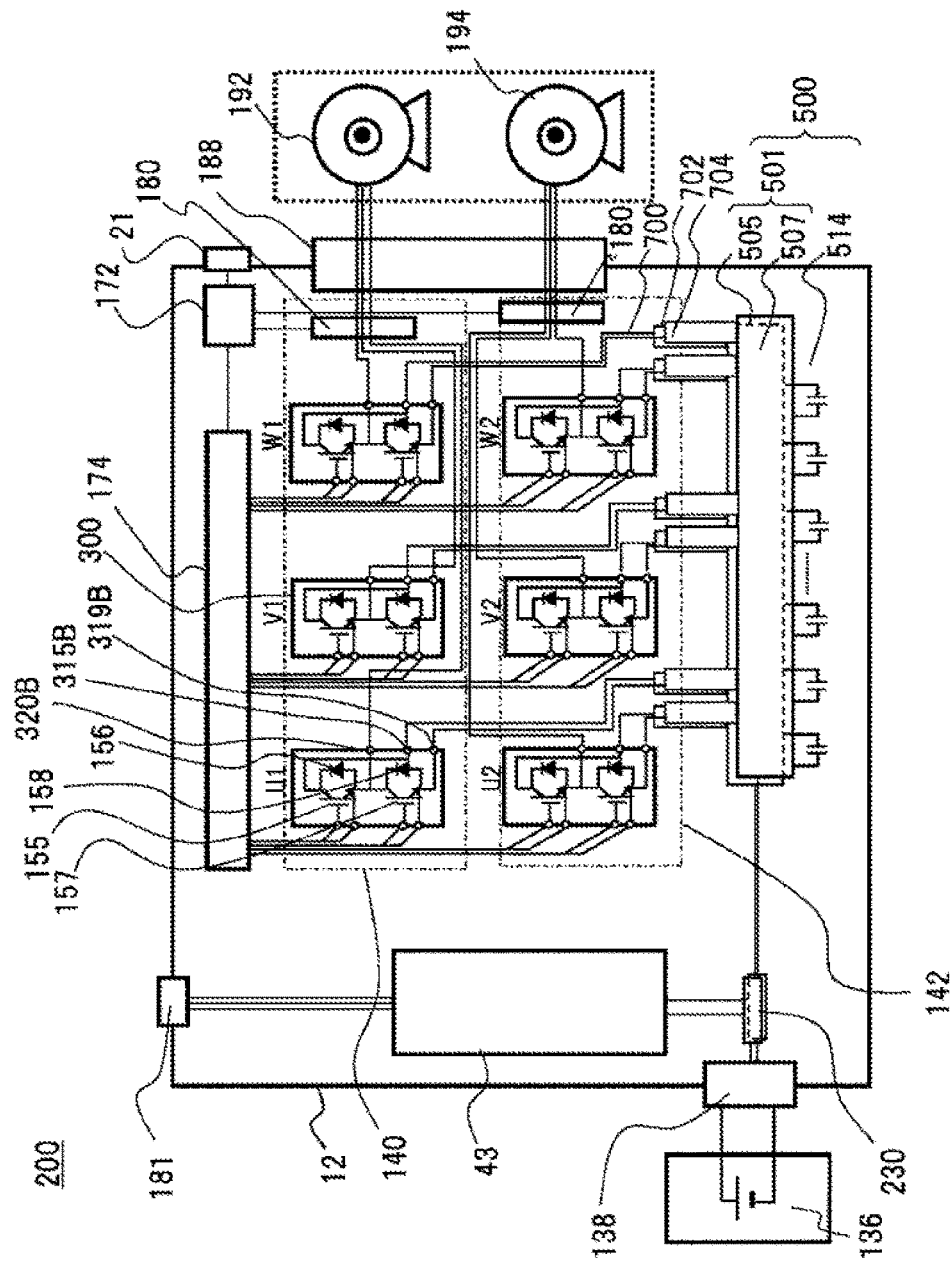
FIG. 10 is a circuit diagram of a power conversion device according to the present invention.

FIG. 10 is a circuit diagram of the power conversion device using the power semiconductor module according to this embodiment. A power conversion device 200 includes inverter circuit units 140 and 142, an inverter circuit unit 43 for an auxiliary machine, and a capacitor module 500. Each of the inverter circuit units 140 and 142 includes a plurality of power modules 300 and the plurality of power modules 300 are connected to configure a three-phase bridge circuit. When a current capacity is large, the power modules 300 are connected in parallel and parallel connection is performed to correspond to individual phases of a three-phase inverter circuit, so that it is possible to correspond to an increase in the current capacity. In addition, power semiconductor elements embedded in the power modules 300 are connected in parallel, so that it is possible to correspond to an increase in the current capacity.

The inverter circuit unit 140 and the inverter circuit unit 142 have the same circuit configuration basically and control methods or operations thereof are basically the same. Here, the inverter circuit unit 140 is described as a representative example. The inverter circuit unit 140 includes the three-phase bridge circuit as a basic configuration. Specifically, the individual arm circuits operated as a U phase (shown by a reference numeral U1), a V phase (shown by a reference numeral V1), and a W phase (shown by a reference numeral W1) are connected in parallel to conductors of the positive electrode side and the negative electrode side transmitting direct-current power. The individual arm circuits operated as the U phase, the V phase, and the W phase of the inverter circuit unit 142 are shown by reference numerals U2, V2, and W2, respectively, similar to the case of the inverter circuit unit 140.

The arm circuit of each phase is configured using an upper-lower arm series circuit in which an upper arm circuit and a lower arm circuit are connected in series. The upper arm circuit of each phase is connected to the conductor of the positive electrode side and the lower arm circuit of each phase is connected to the conductor of the negative electrode side. Alternating-current power is generated in a connection portion of the upper arm circuit and the lower arm circuit. The connection portion of the upper arm circuit and the lower arm circuit of each upper-lower arm series circuit is connected to an alternating-current terminal 320B of each power module 300. The alternating-current terminal 320B of each power module 300 is connected to an alternating-current output terminal of the power conversion device 200 and generated alternating-current power is supplied to a stator winding of a motor generator 192 or 194. Each power module 300 of each phase has the same structure basically and an operation thereof is basically the same. For this reason, the U phase (U1) of the power module 300 is described as a representative example.

The upper arm circuit includes an IGBT 155 for an upper arm and a diode 156 for an upper arm as power semiconductor elements for switching. In addition, the lower arm circuit includes an IGBT 157 for a lower arm and a diode 158 for a lower arm as power semiconductor elements for switching. A direct-current positive electrode terminal 315B and a direct-current negative electrode terminal 319B of each upper-lower arm series circuit are connected to a direct-current terminal for capacitor connection in the capacitor module 500. Alternating-current power output from the alternating-current terminal 320B is supplied to the motor generators 192 and 194.

The IGBTs 155 and 157 receive a drive signal output from one or the other of two driver circuits configuring a driver circuit 174, execute a switching operation, and convert direct-current power supplied from a battery 136 into three-phase alternating-current power. The converted power is supplied to the stator winding of the motor generator 192. In the V phase and the W phase, circuit configurations are almost the same as the circuit configuration in the U phase. For this reason, display of reference numerals 155, 156, 157, and 158 is omitted. Because the power module 300 of the inverter circuit unit 142 has the same configuration as the case of the inverter circuit unit 140 and the inverter circuit unit 43 for the auxiliary machine has the same configuration as the configuration of the inverter circuit unit 142, description thereof is omitted herein.

The power semiconductor elements for the switching are described using the IGBT 155 for the upper arm and the IGBT 157 for the lower arm. The IGBT 155 for the upper arm or the IGBT 157 for the lower arm includes a collector electrode, an emitter electrode (emitter electrode terminal for a signal), and a gate electrode (gate electrode terminal). The diode 156 for the upper arm or the diode 158 for the lower arm is electrically connected between the collector electrode and the emitter electrode of the IGBT 155 for the upper armor the IGBT 157 for the lower arm, as illustrated in the drawings.

The diode 156 for the upper arm or the diode 158 for the lower arm includes two electrodes of a cathode electrode and an anode electrode. The cathode electrodes of the diodes 156 and 158 are electrically connected to the collector electrodes of the IGBTs 155 and 157, respectively, and the anode electrodes thereof are electrically connected to the emitter electrodes of the IGBTs 155 and 157, respectively, such that a direction toward the collector electrode of the IGBT 155 for the upper armor the IGBT 157 for the lower arm from the emitter electrode thereof becomes a forward direction. A metal-oxide semiconductor field-effect transistor (MOSFET) may be used as the power semiconductor element. In this case, the diode 156 for the upper arm and the diode 158 for the lower arm become unnecessary.

Temperature information of the upper-lower arm series circuit is input from a temperature sensor (not illustrated in the drawings) provided in the upper-lower arm series circuit to a microcomputer. In addition, voltage information of the direct-current positive electrode side of the upper-lower arm series circuit is input to the microcomputer. The microcomputer detects an excessive temperature and an excessive voltage on the basis of the information. When the excessive temperature or the excessive voltage is detected, the microcomputer stops the switching operations of both the IGBT 155 for the upper arm and the IGBT 157 for the lower arm and protects the upper-lower arm series circuit from the excessive temperature or the excessive voltage.

Figure 11:
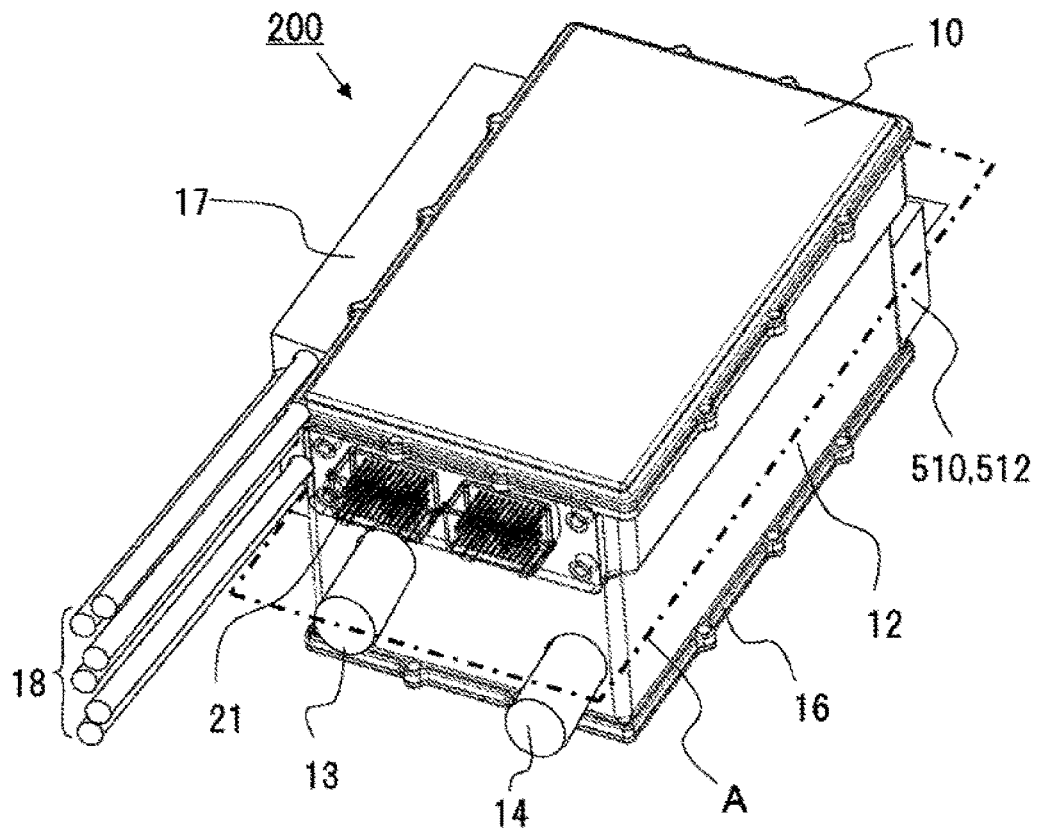
FIG. 11 is a perspective view of a power conversion device according to the present invention.

FIG. 11 is a perspective view illustrating an exterior of the power conversion device 200. The exterior of the power change device 200 according to this embodiment is formed by fixing a casing 12 having a top surface or a bottom surface of almost a longitudinal shape, an upper case 10 provided on one of outer circumferences of a short side of the casing 12, and a lower case 16 to close a lower opening of the casing 12. A shape of a top view or a bottom view of the casing 12 is set to almost a rectangular shape, attachment to a vehicle becomes easy, and productivity is high.

Figure 12:
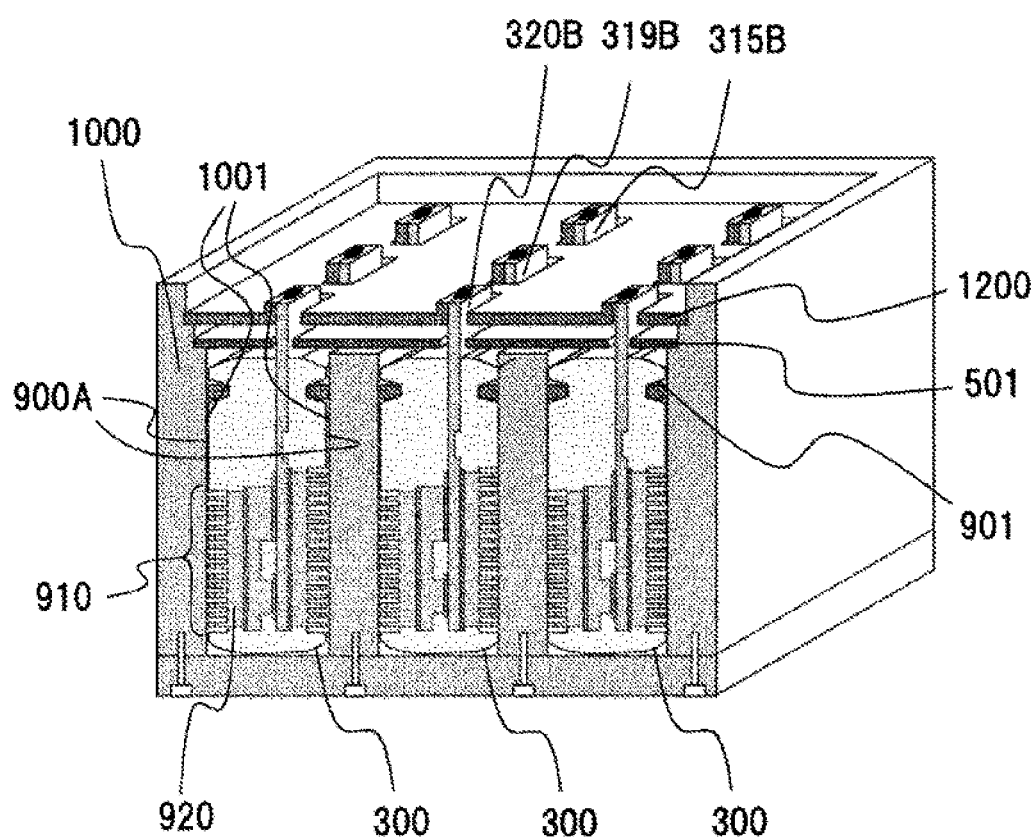
FIG. 12 is a cross-sectional perspective view of a power conversion device according to a first embodiment of the present invention.

FIG. 12 is a schematic diagram illustrating a cross-sectional structure of the power conversion device 200. The power semiconductor module 300 is disposed in a flow channel formation body 1000. The flow channel formation body 1000 forms a cooling medium flow channel to flow a cooling medium to cool the power semiconductor module 300. The flow channel formation body 1000 has a wall surface 1001. The wall surface 1001 forms a flow channel along which the cooling medium flows, between the heat dissipation portion 910 of the power semiconductor module 300 and the wall surface 1001. The wall surface 1001 has a planar structure such that the cooling medium does not flow between the sealing resin surface 900A of the power semiconductor module 300 and the wall surface 1001. The flow channel formation body 1000 is formed such that a distance between the wall surfaces 1001 facing each other and a distance between the sealing resin surface 900A of one side of the power semiconductor module 300 and the sealing resin surface 900A of the other side thereof become almost equal to each other. An elastic body such as an O ring is provided in the sealing portion 901 of the power semiconductor module 300.

The power conversion device 200 has a laminated wiring board 501 and a plate 1200.

After the power semiconductor module 300 is inserted into the flow channel formation body, the laminated wiring board 501 mounted with a mounting component is assembled and a signal terminal and the laminated wiring board 501 are electrically connected. In addition, the terminals 320B, 315B, and 320B through which a large current flows are welded to terminals protruding from the plate 1200 obtained by laminating bus bar wiring lines. Because the laminated wiring board 501 and the plate can be laminated three-dimensionally, the power conversion device can be miniaturized.

The power semiconductor module 300 is inserted into the flow channel formation body 1000 such that the sealing resin surface 900A contacts the wall surface 1001 of the flow channel formation body 1000. Thereby, the power semiconductor module 300 is disposed such that a fin leading edge of the heat dissipation portion 910 formed to become almost the same surface as the sealing resin surface 900A contacts the wall surface 1001 of the flow channel formation body 1000. Therefore, the cooling medium flowing between the heat dissipation portion 910 and the wall surface 1001 can be suppressed from flowing as a bypass flow between the sealing resin surface 900A and the wall surface 1001 or between the fin leading edge and the wall surface 1001. Because the heat dissipation portion 910 is configured using the high thermal conductor 920 having high thermal conductivity, heat of the power semiconductor element can be efficiently cooled. Therefore, the power semiconductor module 300 according to this embodiment has superior reliability.

In addition, the flow channel along which the cooling medium flows is configured using a combination of a fin structure formed at the side of the power semiconductor module 300 and the wall surface 1001 on a plane formed at the side of the flow channel formation body 1000. As such, a structure is simplified, so that the power conversion device can be easily manufactured.

As described above, almost the same surface in this embodiment means that the surface is manufactured to become the same surface. A step generated by the cure shrinkage of the resin or the thermal expansion difference between the members and a step having surface roughness of 100 μm or less rarely affects suppression of the bypass flow and is included in almost the same surface.

The flow channel formation body 1000 is not particularly limited as long as the flow channel formation body 1000 has a watertight structure. However, the flow channel formation body 1000 can be manufactured using metals such as aluminum and aluminum diecast, thermoplastic resin such as polyphenylene sulfide, polybutylene terephthalate, polyamide, polyimide, and polytetrafluoroethylene, or thermosetting resin such as epoxy resin.

Figure 13:
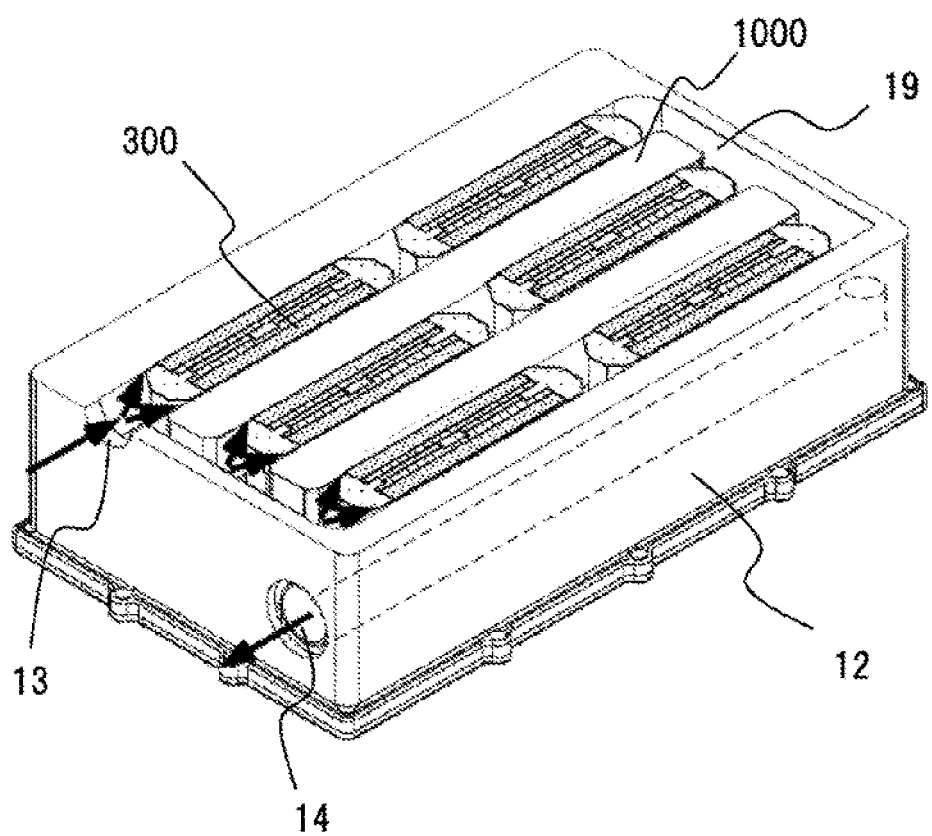
FIG. 13 is a cross-sectional view of a power conversion device according to the present invention.

FIG. 13 is a cross-sectional view in a cross-section A of FIG. 11. The casing 12 forms the flow channel formation body 1000. The cooling medium flowed from a cooling water inlet 13 to a water channel 19 flows through the water channel 19 as shown by an arrow and is discharged from a cooling water outlet 14. In this embodiment, the six power semiconductor devices 300 are disposed along the flow of the cooling water in the water channel 19.

Figure 14A:
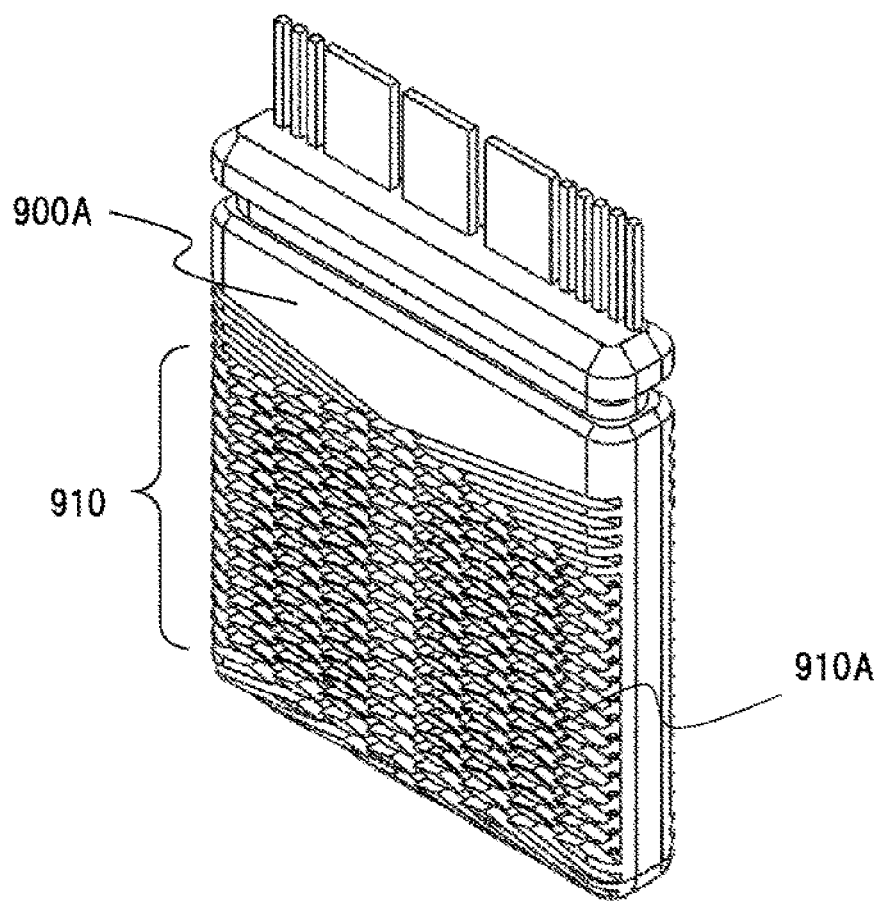
FIG. 14(a) illustrates a first modification of a power semiconductor module according to a first embodiment of the present invention.

FIG. 14(a) is a perspective view illustrating a first modification of the power semiconductor module 300. In the power semiconductor module of FIG. 1, the fin 910A is formed in a shape of a straight fin parallel to a direction where the cooling medium flows. However, a shape of the fin 910A according to this embodiment is a diamond shape.

Figure 14B:
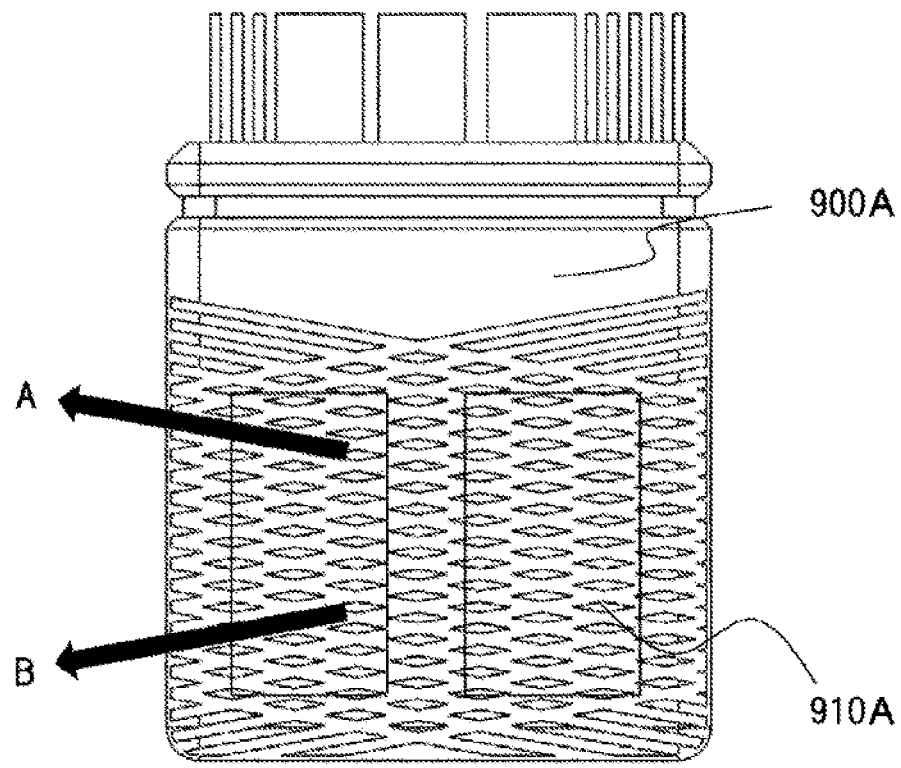
FIG. 14(b) illustrates a first modification of a power semiconductor module according to a first embodiment of the present invention.

In addition, FIG. 14(b) is a plan view illustrating a configuration of the heat dissipation portion 910 of the power semiconductor module 300 of FIG. 14(a). In this embodiment, when the sealing resin surface 900A of the power semiconductor module 300 is ground, different from FIG. 7, the sealing resin surface 900A is ground in a direction A of FIG. 14(b) and is ground in a direction B. As a result, a pin fin of a diamond shape can be formed. Like the heat dissipation portion 910 according to this embodiment, the shape of the fin is set to the pin fin, so that heat dissipation can be improved as compared with the straight fin of FIG. 1.

Figure 15A:
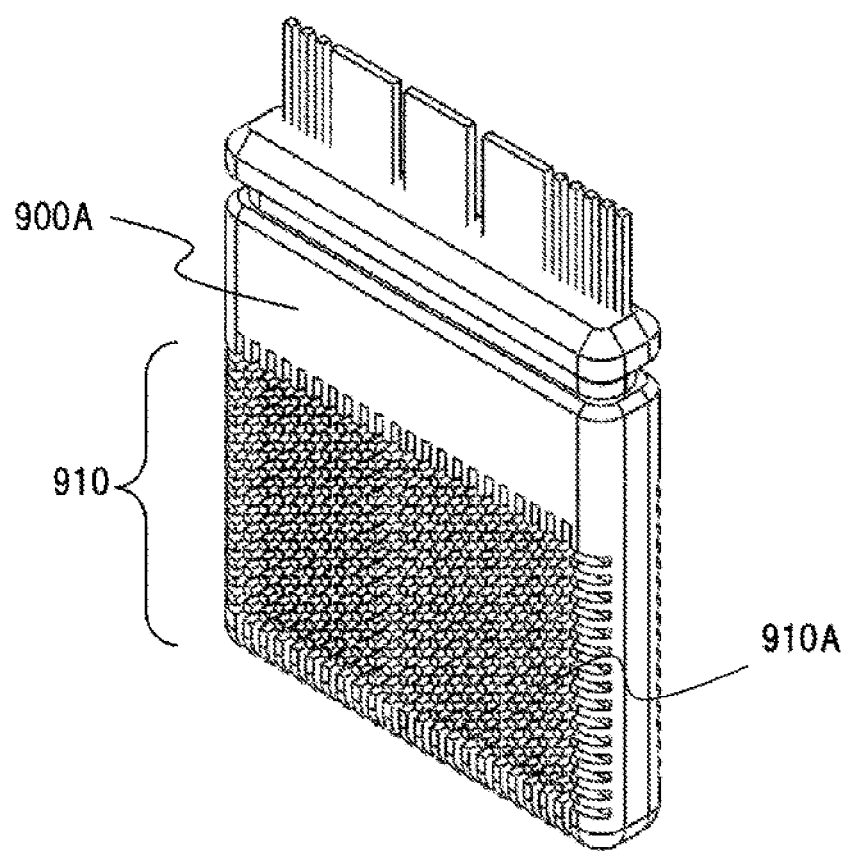
FIG. 15(a) illustrates a second modification of a power semiconductor module according to a first embodiment of the present invention.

FIG. 15(a) is a perspective view illustrating a second modification of the power semiconductor module 300. In the power semiconductor module of FIG. 1, the fin 910A is formed in a shape of the straight fin parallel to the direction where the cooling medium flows. However, a shape of the fin 910A according to this embodiment is a square shape.

Figure 15B:
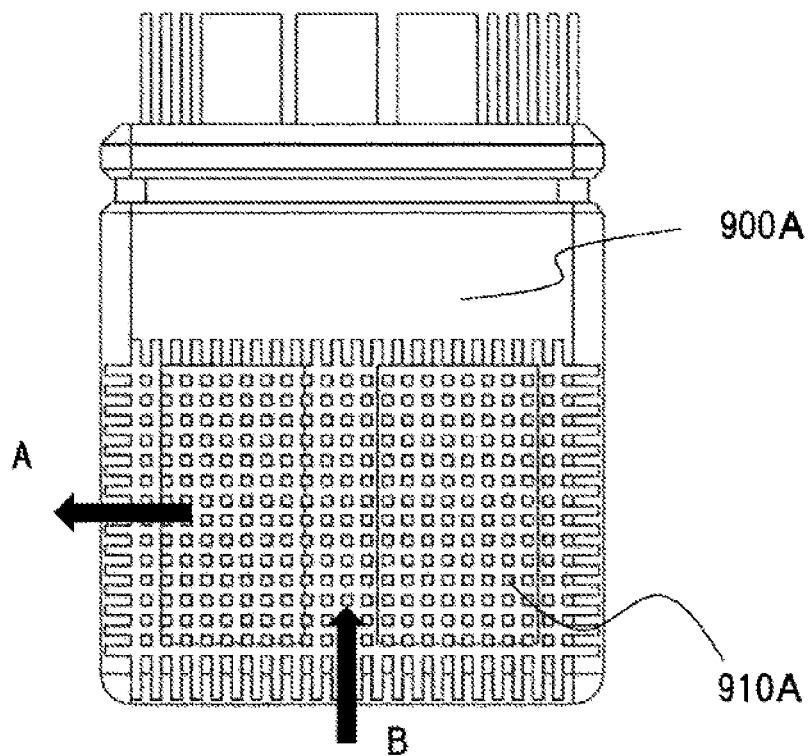
FIG. 15(b) illustrates a second modification of a power semiconductor module according to a first embodiment of the present invention.

In addition, FIG. 15(b) is a plan view illustrating a configuration of the heat dissipation portion 910 of the power semiconductor module 300 of FIG. 14(a). In this embodiment, when the sealing resin surface 900A of the power semiconductor module 300 is ground, different from FIG. 7, the sealing resin surface 900A is ground in a direction A of FIG. 15(b) and is ground in a direction B. As a result, a pin fin of a square shape can be formed. Like the heat dissipation portion 910 according to this embodiment, the shape of the fin is set to the pin fin, so that heat dissipation can be improved as compared with the straight fin of FIG. 1.

The present invention is not limited to this embodiment. In the power semiconductor module according to the embodiment, electroless nickel plating is performed after performing electroless copper plating on a contact surface with the cooling water below the sealing portion. As a result, the sealing resin can be prevented from directly contacting the cooling water and chip insulation performance can be suppressed from being deteriorated due to absorption of water in the sealing resin.

Figure 16A:
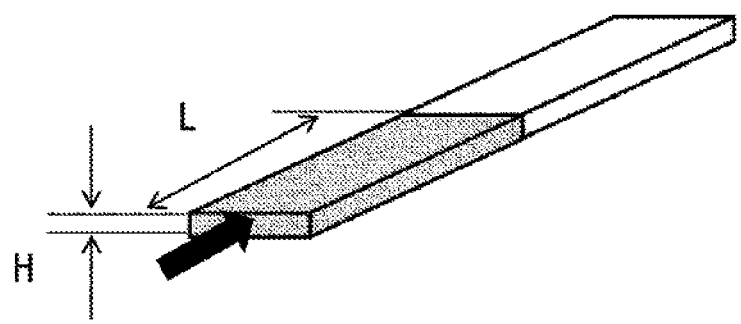
FIG. 16(a) illustrates a relation of a filling distance and a gap in transfer molding.

Next, a relation of a filling distance L of the sealing resin and a gap H will be described. FIG. 16(a) is a schematic diagram illustrating the relation of the filling distance L of the sealing resin and the gap H. In addition, FIG. 16(b) is a graph illustrating the filling distance L when the sealing resin is injected from an end of the gap, with respect to the gap of the thickness H.

Figure 16B:
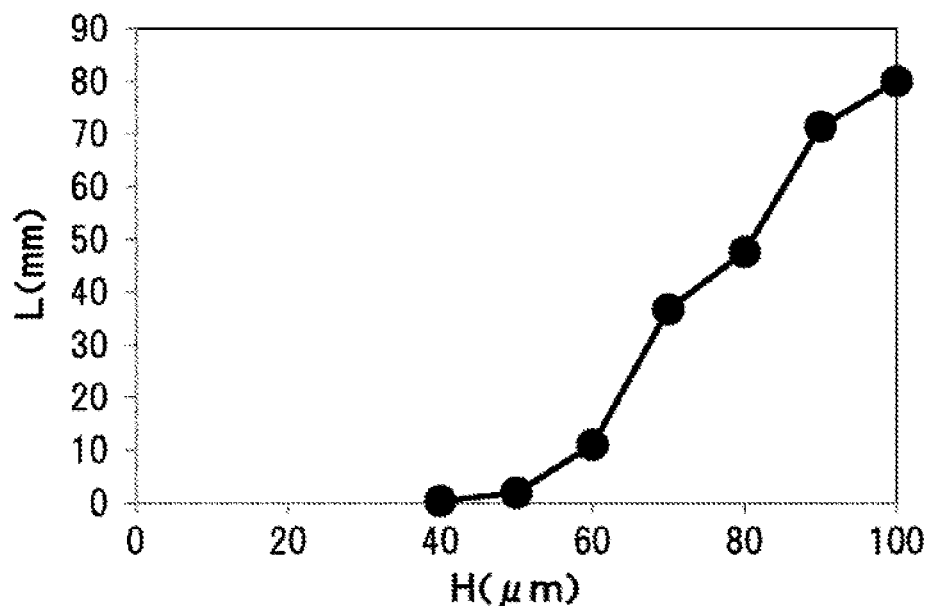
FIG. 16(b) illustrates a relation of a filling distance and a gap in transfer molding.

As illustrated in FIG. 16(b), when the gap H increases, the filling distance L tends to increase. When the gap H is 50 μm or less, the filling distance L is about several mm. Therefore, it is known that the filling resin is rarely filled, when the gap H is 50 μm or less.

Figure 17:
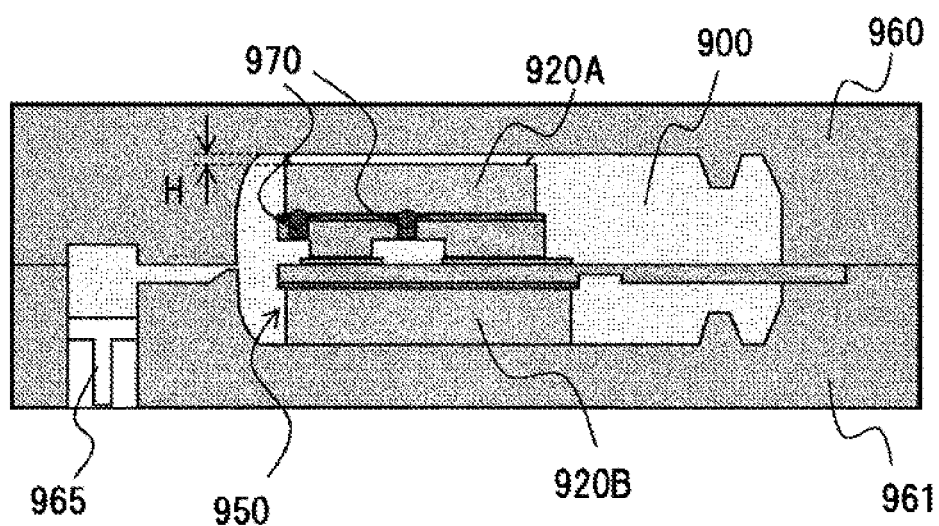
FIG. 17 is a cross-sectional view of a transfer molding process.

FIG. 17 illustrates a cross-sectional view of the power semiconductor module 300 at the time of transfer molding. The sealing resin 900 of the power semiconductor module 300 is formed by setting the lead assembly 950 to the transfer molding molds 960 and 961 and performing the transfer molding. At this time, a high thermal conductor 920B of the lead assembly 950 disposed at the side of the mold 961 is pushed to the mold 961.

In FIG. 17, a high thermal conductor 920A of the lead assembly 950 disposed at the side of the mold 960 is disposed at the gap H of 50 μm between the mold 960 and the high thermal conductor 920A. When the gap between the mold 960 and the lead assembly 950 is set to 50 μm, the sealing resin 900 is not filled between the high thermal conductor 920A of the lead assembly 950 and the mold 960. In addition, the sealing resin 900 is not filled between the high thermal conductor 920B of the lead assembly 950 and the mold 961. As a result, on both surfaces of the power semiconductor module, the high thermal conductors 920A and 920B can be formed in a state in which the high thermal conductors 920A and 920B are exposed from the sealing resin 900.

However, in the power semiconductor module 300 manufactured as described above, because peeling stress is applied to metallization of the chip by a molding pressure at the time of transfer molding, it is difficult to improve reliability due to the damage of the chip or the like. The molding pressure at the time of the transfer molding acts as a hydrostatic pressure in a step before resin curing and the peeling stress occurs as stress to push up the lead assembly 950, as shown by an arrow 970 in the drawing. In this way, the strong peeling stress is applied to the chip, so that the metallization of the chip may be peeled.

Figure 18:
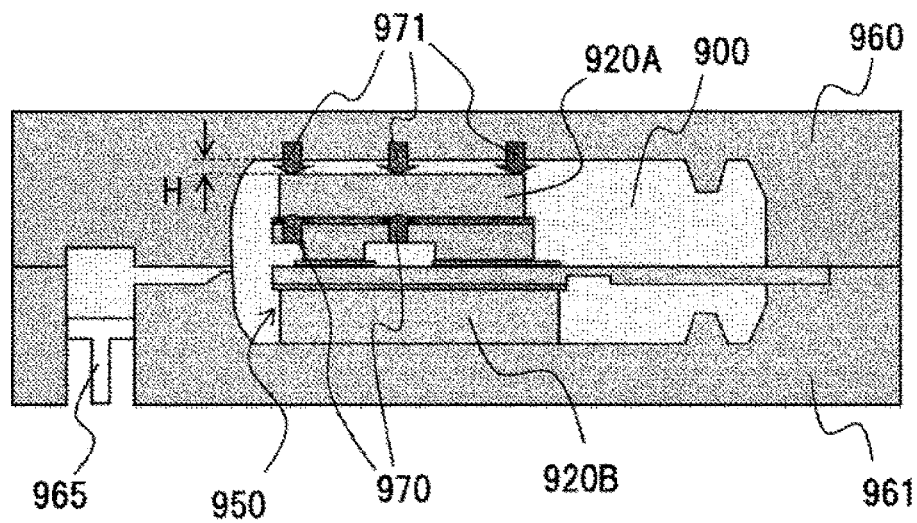
FIG. 18 is a cross-sectional view of a transfer molding process.

Next, FIG. 18 illustrates the case in which the gap H between the lead assembly 950 and the mold 960 is set to 100 μm. The gap H between the lead assembly 950 and the mold is set to 100 μm, so that the resin is flowed and filled between the high thermal conductor 920A and the mold 960.

At this time, similar to FIG. 17, the stress to push up the lead assembly 950 to the mold 960 as shown by an arrow 970 is applied to the lead assembly 950. However, at the same time, downward stress is applied as shown by an arrow 971, by the sealing resin filled into the gap of the high thermal conductor 920A and the mold 960. As such, on one surface of the lead assembly 950, the sealing resin is flowed and filled, so that the hydrostatic pressure by the sealing resin is balanced. Therefore, the excessive peeling stress is suppressed from being applied to the chip, as illustrated in FIG. 17. As a result, the chip can be suppressed from damaging at the time of the transfer molding and the power semiconductor module can be manufactured with high reliability. Then, in the power semiconductor module, as illustrated in FIG. 7, cutting processing is performed, so that the fins are formed.

Second Embodiment

Figure 19:
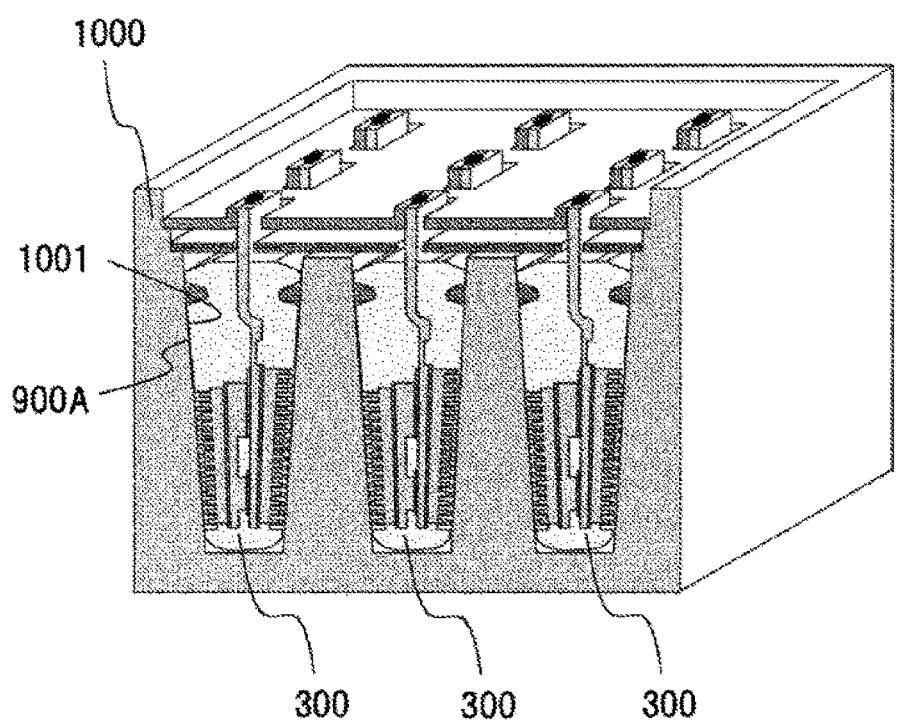
FIG. 19 is a cross-sectional perspective view of a power conversion device according to a second embodiment of the present invention.

FIG. 19 illustrates a cross-sectional perspective view of a power conversion device according to a second embodiment. The second embodiment changes from the first embodiment in that a water channel formation body 1000 has a tapered shape and a power semiconductor module also has a tapered shape to correspond to the tapered shape of the water channel formation body 1000. By the tapered shape, the power semiconductor module can be easily inserted.

Third Embodiment

Figure 20:
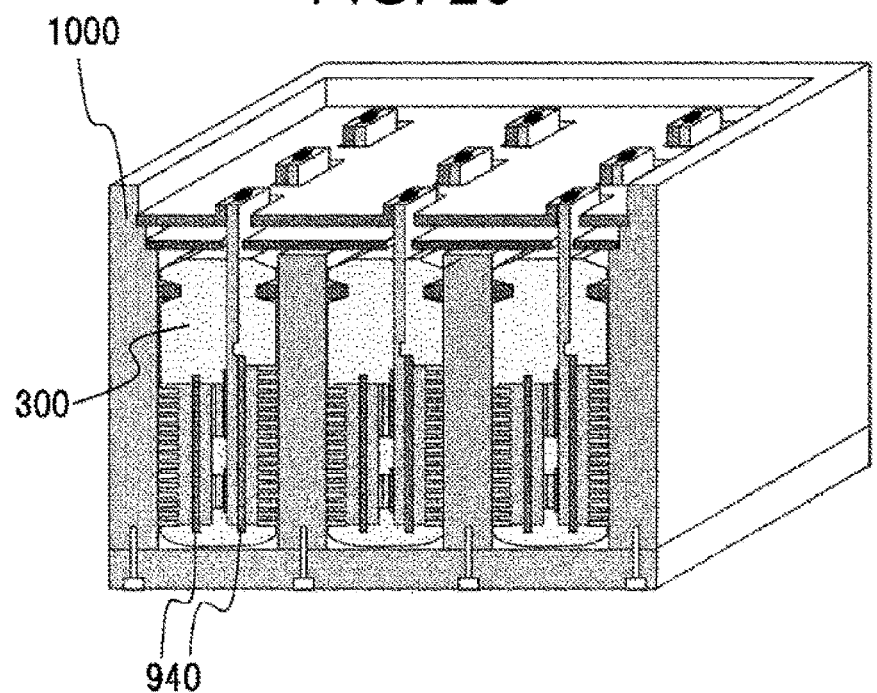
FIG. 20 is a cross-sectional perspective view of a power conversion device according to a third embodiment of the present invention.

FIG. 20 illustrates a cross-sectional perspective view of a power conversion device according to a third embodiment. The third embodiment changes from the first embodiment in that ceramic is used in an insulating layer 940 of a power semiconductor module. By using a substrate where the insulating layer is the ceramic, an insulation property can be improved as compared with a resin sheet.

Fourth Embodiment

Figure 21:
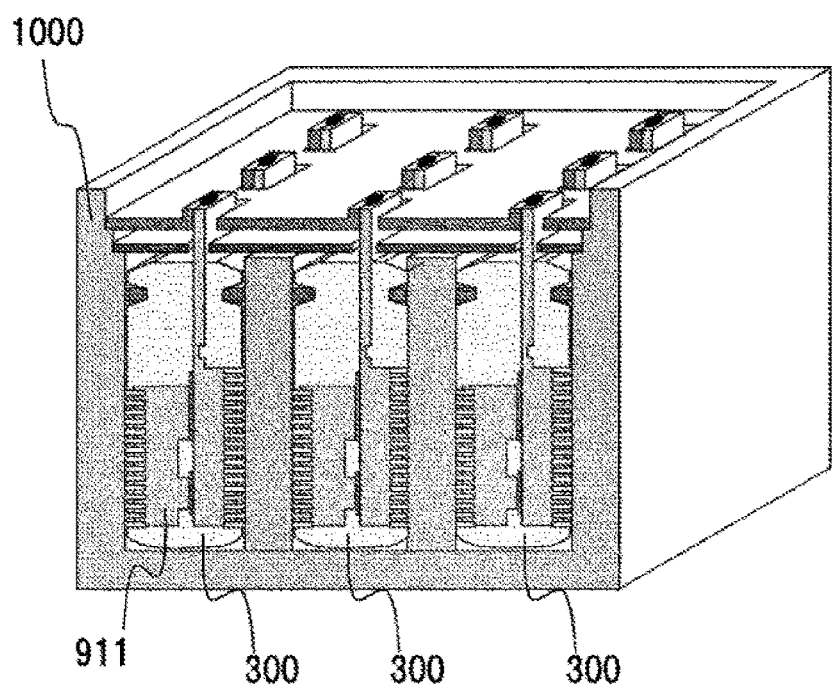
FIG. 21 is a cross-sectional perspective view of a power conversion device according to a fourth embodiment of the present invention.

FIG. 21 illustrates a cross-sectional perspective view of a power conversion device according to a fourth embodiment. The fourth embodiment changes from the first embodiment in that a water channel formation body 1000 is made of a resin, a lead frame 911 of a power semiconductor module becomes a heat dissipation portion and an insulating layer 940 is not provided, and a cooing medium is insulating oil. Because the insulating oil is used for the cooling medium, the insulating layer is unnecessary in the power semiconductor module, so that the power conversion device can be miniaturized.

REFERENCE SIGNS LIST 10 upper case
12 casing
13 cooling water inlet
14 cooling water outlet
16 lower case
18 alternating-current terminal
19 flow channel
22 drive circuit board
43 inverter circuit
110 hybrid vehicle
112 front wheel
114 front wheel axle
116 differential gear
118 transmission
120 engine
122 power distribution mechanism
136 battery
138 direct-current connector
140 inverter circuit
142 inverter circuit
155 IGBT for upper arm
156 diode
157 IGBT for lower arm
172 control circuit
174 driver circuit
180 current sensor
192 motor generator
194 motor generator
195 motor
200 power conversion device
230 input laminated wiring board
300 power semiconductor device
321 alternating-current terminal
500 capacitor module
501 laminated wiring board
505 negative electrode lead frame
507 positive electrode lead frame
514 capacitor cell
702 positive electrode-side electrode lead frame
704 negative electrode-side electrode lead frame
900 sealing resin
900A sealing resin surface
901 sealing portion
910 heat dissipation portion
919A fin
911 lead frame
912 tie bar
920 high thermal conductor
920A high thermal conductor
920B high thermal conductor
930 collector-side lead set
931 emitter-side lead set
940 insulating layer
945 temperature sensor
950 lead assembly
960 transfer molding mold
961 transfer molding mold
965 plunger
1000 flow channel formation body
1001 wall surface
1200 plate

The invention claimed is:

1. A power conversion device comprising:
a power semiconductor module comprising a power semiconductor element configured to convert a direct current into an alternating current; and
a flow channel formation body on which the power semiconductor module is disposed, wherein the power semiconductor module comprises a high thermal conductor which is disposed at a position between the semiconductor element and the flow channel formation body, and a sealing material that seals the power semiconductor element and the high thermal conductor, the high thermal conductor comprises a fin protruding toward the flow channel formation body at a side of the flow channel formation body, and a portion of the sealing material that surrounds and does not cover the high thermal conductor and a leading edge of the fin are on a same plane.

2. The power conversion device according to claim 1, wherein the leading edge of the fin comprises a same material as does the sealing material.

3. The power conversion device according to claim 1, wherein the fin is formed by grinding the sealing material sealing the high thermal conductor in a groove shape.

4. The power conversion device according to claim 1, wherein the sealing material comprises a sealing portion to secure airtightness of a flow channel when the power semiconductor module is disposed on the flow channel formation body.

5. The power conversion device according to claim 3, wherein the fin is formed in a pin fin shape.

6. The power conversion device according to any one of claim 1, wherein the high thermal conductor is formed of a material containing carbon.

7. The power conversion device according to claim 1, wherein, in the sealing material, a surface of a flow channel side of the flow channel formation body is plated.

8. A method of manufacturing a power semiconductor module including a power semiconductor element converting a direct current into an alternating current, a high thermal conductor thermally connected to the semiconductor element, and a sealing material sealing the power semiconductor element and the high thermal conductor, the method comprising:

a first step of sealing the high thermal conductor with the sealing material; and a second step of processing the sealing material and the high thermal conductor integrally and forming a fin such that a portion of the sealing material that surrounds and does not cover the high thermal conductor and a leading edge of the fin are on a same plane.

9. The method of manufacturing a power semiconductor module according to claim 8, wherein, in the first step, the sealing material covers a surface of the high thermal conductor opposite to a side where the power semiconductor element is disposed and seals the high thermal conductor.

10. The method of manufacturing a power semiconductor module according to claim 8, wherein the fin is formed by grinding the sealing material sealing the high thermal conductor in a groove shape.

11. The power conversion device according to claim 1, wherein the high thermal conductor comprises a plurality of fins including the fin, the fins are spaced by respective gaps, and portions of the high thermal conductor disposed between the fins are exposed from the sealing material.

* * * * *